United States Patent [19]
McCabe

[11] Patent Number: 6,046,401
[45] Date of Patent: Apr. 4, 2000

[54] DISPLAY DEVICE INTEGRATED INTO A PHOTOVOLTAIC PANEL

[76] Inventor: Joseph Christopher McCabe, 5411 Lincoln St., Bethesda, Md. 20817

[21] Appl. No.: 09/275,892

[22] Filed: Mar. 25, 1999

[51] Int. Cl.[7] .............................. H01C 31/02; G09G 3/14
[52] U.S. Cl. .......................... 136/244; 136/291; 368/83; 368/205; 345/46; 323/906
[58] Field of Search ................................. 136/291, 244; 40/544; 345/46; 368/83, 84, 204, 205; 350/338; 323/906

[56] References Cited

U.S. PATENT DOCUMENTS

| | | | |
|---|---|---|---|
| 4,918,357 | 4/1990 | Waterbury | 315/87 |
| 4,947,300 | 8/1990 | Wen | 362/183 |
| 4,982,176 | 1/1991 | Schwarz | 340/567 |
| 5,192,944 | 3/1993 | Otsuki et al. | 340/765 |
| 5,196,781 | 3/1993 | Jamieson et al. | 320/61 |
| 5,231,781 | 8/1993 | Dunbar | 43/17.5 |
| 5,253,150 | 10/1993 | Vanni | 362/183 |
| 5,262,756 | 11/1993 | Chien | 340/332 |
| 5,329,716 | 7/1994 | Fite | 40/575 |
| 5,692,647 | 12/1997 | Brodie | 222/173 |
| 5,797,132 | 8/1998 | Altwasser | 705/16 |

*Primary Examiner*—Nam Nguyen
*Assistant Examiner*—Michael C. Miggins

[57] ABSTRACT

A display device comprising a photovoltaic (PV) panel adapted to simultaneously produce electrically needed to operate a display and form either the background or foreground of the said display. The PV panel comprises large continuous sheets of PV material provided with one or more openings. Either light for the display or the display mechanism itself pass through the openings in PV material. The device may include a computer or electrical circuit which will activate the display device responsive to temperature, moisture, light conditions or to a remote signal such as a pager.

10 Claims, 4 Drawing Sheets

DISPLAY DEVICE INTEGRATED INTO A PHOTOVOLTAIC PANEL

BACKGROUND OF THE INVENTION

Solar cells and photovoltaic (PV) panels, have evolved from bulky inefficient cells to light weight, thin, highly effective producers of electricity from sunlight. Similarly, light emitting diodes (LED's) have become light weight, small and efficient users of electricity to produce light.

This invention combines photovoltaic panels and electrically produced light, such that the light is integrated into the interior of the electrically producing photovoltaic materials. This integration consists of holes in the electric producing photovoltaic materials which facilitate display of the electrically produced light. This light may be produced by electrical, or chemical reactions similar to light emitting diodes, electroluminescent materials, a phosphorescent substance, chemiluminescent technology, excitation of inert gas in neon lighting, and fluorescent lighting.

In prior art devices holes were provided in solar cells in order to increase the production of electricity, by increasing surface area due to holes, or by channeling various photovoltaic materials from various layers into adjacent layers to produce a more efficient solar cell. Note for example U.S. Pat. No. 4,795,500 and 5,468,988.

Additionally, holes have been placed in PV materials to allow day-lighting through the cells, for use of the natural light inside buildings or cars as in U.S. pat. No. 5,254,179.

Also it is known to combine photovoltaic materials, batteries and electronic circuits to produce display devices. Note for example U.S. Pat. No. 4,006,583, 4,759,735 and 5,523,776.

BRIEF SUMMARY OF THE INVENTION

The invention is produced by including a hole, or holes, directly in the photovoltaic material for mounting a light. In a first embodiment light from a point source, such as a light emitting diode, is allowed to pass through the holes from the dark side of the photovoltaic, or PV panel, which may comprise a single PV cell or a number of cells, to produce a display on the light receiving side of the PV panel, or in a second alternative embodiment light emitting diodes or some other display means are placed directly into this hole or holes to project out on the front face of the PV panel. The PV material is not adversely affected by any shadows onto the PV material and the holes do not result in a significant loss of power output.

This design produces a product that is lower in cost than if the lighting was packaged outside the PV cells. Panels produced in accordance to this invention are portable and can be flexible. By combining the PV cells and the display, the whole system costs are reduced in comparison with a PV cell, with having a separate display system. The size, weight, and expense are reduced, while the portability, efficiency and reliability are increased.

Using the PV panel as the light supporting structure enables the units to be sealed and compact. Such sealed units are more reliable and can be made resistant to mishap or vandalism. The specific use of the PV material, integrated with the display, will also reduce theft because the perforated panels are easily identified and do not appear to be as desirable for other uses.

It should be noted that putting a hole in the cell typically does not hurt the cells, except that the area taken up by the cell can no longer produce electricity from light energy.

Some PV materials need to have the holes placed in cells in a special process, for instance, amorphous cells should not have a hole punched from the front to the back, rather, it is better to place the hole from the back to the front to prevent shorting out the material.

This design optimize a small amount of holes to produce a utility lighting function. Holes are integrated into the PV materials so as to not adversely effect the operation of the light to electrical energy conversion process of the PV materials.

Panels according to this invention may be activated by darkness and motion detection to turn on a highly visible LED for lighting a path at night.

Alternatively the panel could turn on an infrared LED thus illuminating an area for infrared television monitors without letting an intruder know that he has been detected. Such a device would be useful in battle situation or about protected compounds. The light could flash on and off, in a code such that the pattern would give information regarding the motion that was detected and when it was detected.

Panels according to the invention can be used as a sign displaying information or warning drivers about road conditions. One example of such a sign is a flashing arrow of LED lights, used for directing drivers away from a stalled vehicle. In this case a sign can be rotated to direct traffic to the right or left about the stalled vehicle. When the panel is carried on the shelf by the rear window of a car, ambient light would maintain the battery at full charge, ready to use during a breakdown for directing traffic away from a broken down car.

An EXIT sign is another application of this design, with the letters E-X-I-T, spelled out with LED lights integrated into a PV material. Such a panel could have a means of sensing the light levels in a location, if the ambient lighting levels are lowered, indicating a potential emergency situations, the sign would turn on, and flash. This would eliminate the need for electrical lines for the sign installation, thus making the installation much less expensive. Such signs would be particularly useful for temporary buildings such as tents used for circuses or for selling merchandise. This sign could be designed to provide either a constant illumination, or flashing illumination.

Property and house street numbering is facilitated by this design, because it is frequently necessary to place such signs where they are visible from the street, and often this location may be a long distance from any electrical outlet. In the daytime, batteries would be charged by the PV cells, at night the numbers would be illuminated showing the address of the property. It should be noted here that large PV cells are preferred because holes for forming the outline of letters or numbers can be punched almost anywhere in the interior of a cell with out seriously affecting the operation of that cell.

Other applications include attracting attention to billboard signs. In this case the sign itself would be a PV panel provided with the display. The message could be integrated into the configuration of the sign with LED lights.

Signs according to this invention could be activated by temperature to produce a message like "FREEZING CONDITIONS", or signs can be activated by moisture sensors to indicate "SLIPPERY WHEN WET" condition. Signs can be turned on by various light levels, or by darkness. Signs can be turned on in response to the detection in motion.

Alternatively remotely located signs can include a computer chip which will receive and display any number of messages responsive to a signal from a communication device.

It is an object of this invention to create a unit that produces its own power from ambient light energy.

It is a further object to produce a display device which is compact, inexpensive, vandal resistant and extremely reliable, which then lights electrically efficient bulbs.

It is a further object to produce a panel that need not be optimally oriented to collect solar energy, but combines the ability to display lighting efficiently, when and where it is needed. In doing so, it eliminates the requirement of optimally orientation relative to the sun.

It is a further object to produce a display device which includes an electrical storage unit such as a battery to produce electricity and light when the ambient light energy is not available.

Alternatively it is an object of the invention to provide a solar electric system sized to directly power electrical lights of a display utilizing only ambient light and thus operate without an electrical storage unit.

DETAILED DESCRIPTION OF THE INVENTION

Figure 1:
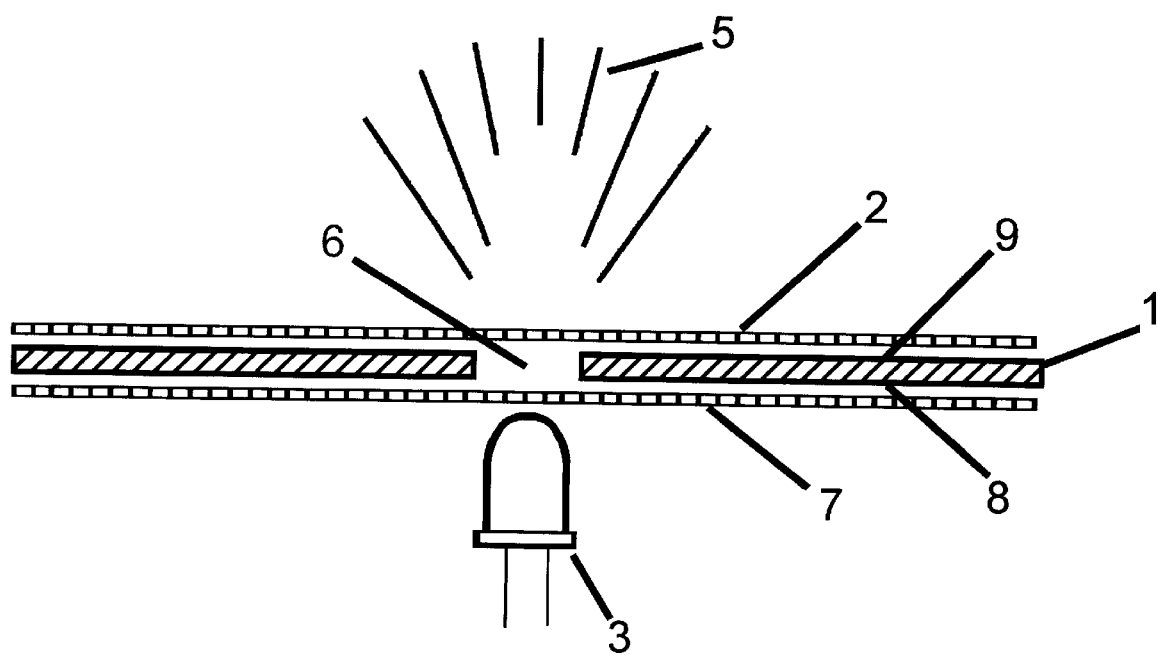
FIG. 1 shows a section of first embodiment of the invention taken along line 1—1 of FIG. 4.
Figure 4:
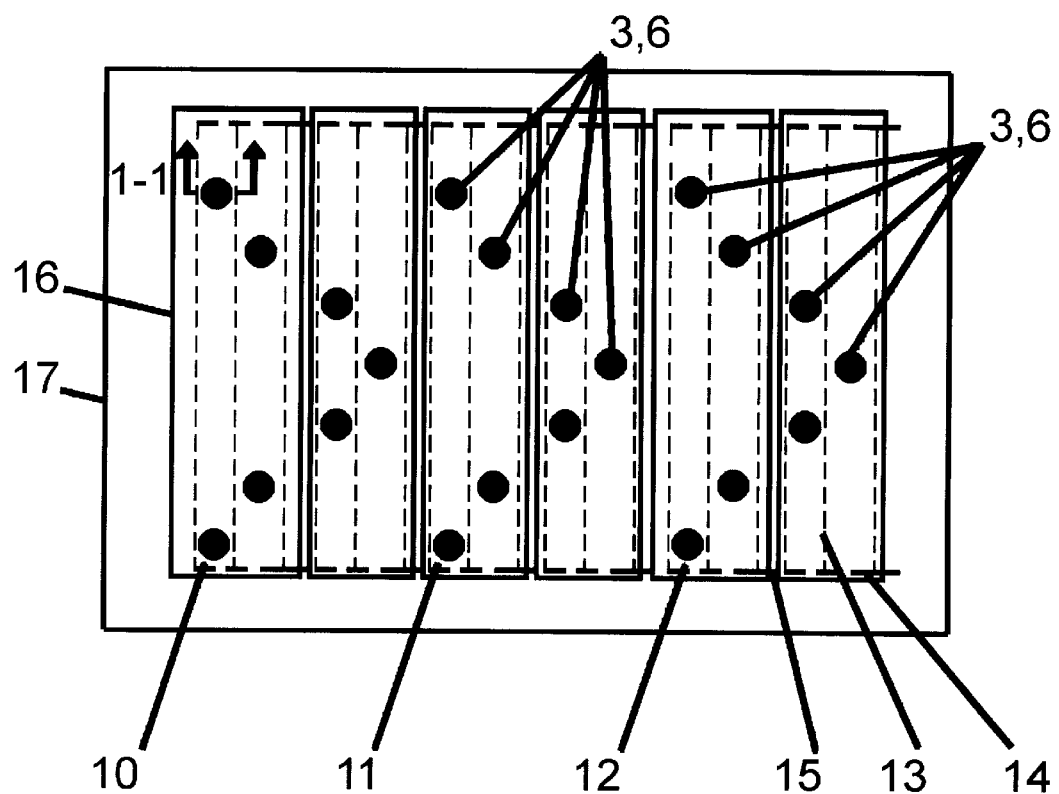
FIG. 4 shows the front face of a sign in accordance with the preferred embodiment.

FIGS. 1 and 4 show a first preferred embodiment of the invention comprising an emergency blinker to be carried in a car and designed for use during emergencies to direct traffic around a stalled or disabled vehicle or an object in the roadway.

As shown in the FIG. 4, the emergency blinker comprises a PV panel 17 having six cells 16. Each cell 16 has a nearly invisible grid of vertical and horizontal conductors 13, 14 embedded therein and electrical connectors 15 which may connect the cells in series or parallel. The panel further includes apertures 6 positioned in three rows 10, 11, 12 forming arrows pointing to the right. When providing apertures in a photovoltaic panel it is important to carefully position each aperture so that it does not cut any of the grid wires 13, 14 but an almost infinite number of shapes and patterns are still possible with only negligible loss to the electric generating capacity of the panel. In operation these rows would light in sequential order 10, 11, 12, 10, 11, . . . to clearly give oncoming traffic the idea that it should move to the right about the object.

FIG. 1 is a diagrammatic view taken along line 1—1 in FIG. 4 showing a single LED light 3 provided behind each of the aperture 6. A timing circuit shown in block diagram in FIG. 2 sequentially lights the rows of lights to direct traffic right around a stalled vehicle or object in the road. The PV cells forming the front face of the display panel extend both above and bellow the Led lights forming arrows 10, 11, 12. As seen in the drawing, the PV panel 1 has a front surface 9 to be exposed to ambient light and a back surface 8 to which lights 3 are mounted. In this embodiment the PV panel is provided with transparent or translucent coatings 2 and 7 which cover the front and rear surfaces of the panels and may fill openings 6. Light 5 emitted by the LED is clearly visible to oncoming traffic thought the aperture 6.

In FIG. 4 I have shown a series of PV cells forming a panel having a series of apertures. Alternatively it should be noted that this could be a single cell forming the entire PV panel.

Each PV cell used in the display panel is relatively large preferably extending the height of the panel so that electrical connections between adjacent cells are above or below the display. This means that there is no danger that the holes forming the display will inadvertently puncture the electrical connection between adjacent cells, but it is also possible to provide apertures in a grid of PV cells which extends both vertically and horizontally.

In place of the arrows shown in FIG. 4 any indicia is possible. House numbers, warning signs, Exit signs or multi color animated displays are only a few of the possibilities.

I have shown multiple openings forming a coherent display, but the scope of the invention should not be limited there to. It is also contemplated that a number of panels could be provided each having only a single opening and a highly visible single light. These panels would be provided along a path or trail to illuminate the way for foot traffic in areas where no electricity exists. In order to conserve energy the Condition Sensor of FIG. 2 could be activated by the conditions of darkness and sensed movement only.

Alternatively, each panel could be provided with one or more infra-red lights and the motion detectors could be placed in such a way as to detect movement into a restricted area such as a battle field. The infra red light would alert snipers or watchers with infra-red scopes with out alerting the intruder to the fact that his intrusion has been detected.

In prior art devices the display panel and the solar collecting panel were provided on separate panels. This permitted the display panel to be oriented at the best viewing angle while the solar panel was oriented at the best light collecting angle relative to ambient light. The prior art configuration increase the cost of the device and increase by many fold the possibility to being damaged because of the external wire connecting the panels. Also, the fact that there are external wires makes it difficult to provide a sealed unit.

Combining the PV and display panels means that the light collector must be positioned for optimal viewing rather than for optimal light collection consequently there must be greater emphasis on conserving electrical energy. The unitary nature of the instant device makes that unit so inexpensive that it can be afforded by anyone who can afford an automobile and so reliable that it could be used under water or at least in a heavy rain storm with out danger of malfunction. The device of the instant invention can be stored on the shelf near the back window of a car and the ambient light will be more than enough to maintain an internal battery pack in fully charged condition.

It is also contemplated that the On/Off/Auto switch could be replaced by a receiver for receiving signals similar to those transmitted for a pager, and the flasher display circuit would respond to the received signal by displaying one of several messages stored in a memory register. Such a device could be used to change the speed limit along a highway in order to allow for changing weather conditions.

Another strategy for conserving energy would be to flash the sign and to increase the length of time between flashes as the battery becomes weakened.

If it were desirable to have a panel which was lit only during the day the electrical storage, the On/Off/Auto switch and the condition sensor could be eliminated and the PV panel could operate the lights directly.

For most situations LED's are preferred because of their efficiency and brightness, but for a panels to be used as an air rescue device a strobe light would produce enough light to be seen by passing airplanes. Other alternatives include electroluminescent lighting, phosphorescent substance, chemiluminescent technology, neon lighting, fluorescent lighting, infra-red light or incandescent light.

Figure 2:
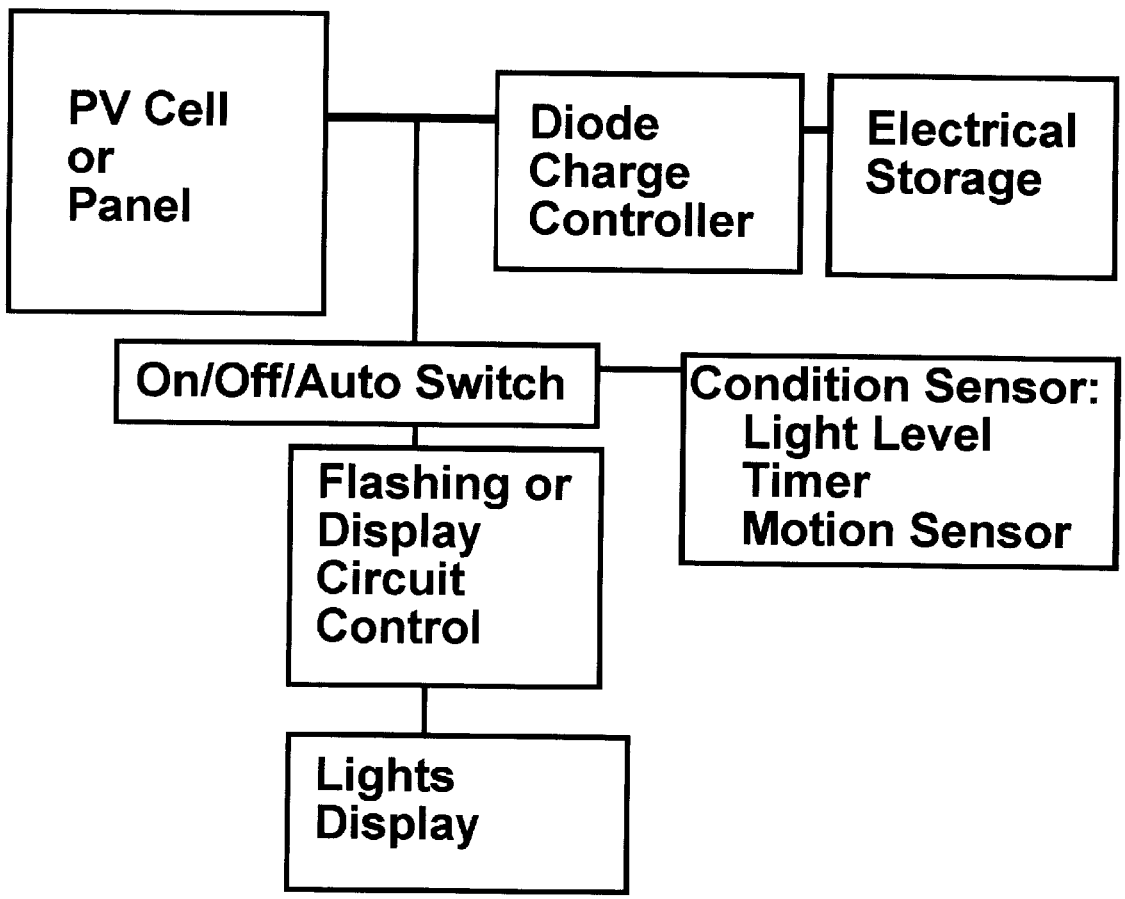
FIG. 2 shows a block diagram of the various components of the display and PV system.

In FIG. 2 I have shown an On/Off/Auto switch for use in the flasher of FIG. 4. In the "off" position the solar panel would charge or maintain the battery pack but the lights would never come on. In the "on" position the lights would be on while the solar panel simultaneously charges the battery. In the "auto" position the battery would be charged as usual but the lights would be controlled and turned on only when the proper conditions are sensed. For example darkness and/or time combined with motion detection could be used to turn on the lights only after dark and only when a car is approaching. This latter setting could be used when it is necessary to abandon a vehicle over night and it is feared that the battery might not last till morning light for recharging.

By adding a temperature sensing means to the circuit of FIG. 2 one could illuminate a sign which says "WARNING ICE CONDITIONS". With this sort of controller the device could be set to operate only when the light level and temperature sensors determine that there is likely to be ice and the timer can be used to see that the device only operates at night and is not affected by oncoming headlights. A motion detector would cause the device to operate only when an approaching car is detected.

Figure 3:
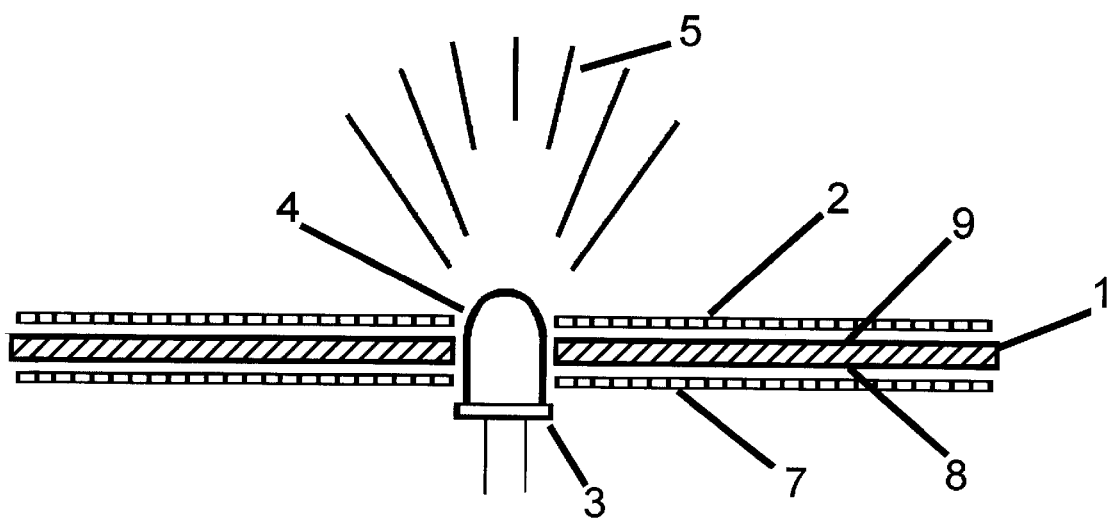
FIG. 3 shows a second embodiment where a display light passes through a hole in the PV panel.

A second preferred embodiment is shown in FIG. 3. This embodiment is similar to that of FIG. 1 in that it again includes a PV panel 1 having a front surface 9 back surface 8 with transparent or translucent coatings 2 and 7. In the FIG. 3 embodiment openings 6 in the PV panel are not filled or covered by the coatings. Instead the front end 4 of the LED 3 projects through the PV panel 1 to emit its light 5 on the front face of the panel.

Typically, PV cells and panels are encapsulated in glass 2, to keep weather effects away from the cells. Holes can be place in the encapsulant, the lights placed into the holes and the encapsulant and lights can then be sealed or re-encapsulated to form an integral sealed unit.

For the sake of simplicity no attempt has been made to show specific wire diagrams of circuits needed to carry out the invention. It is understood that such circuits are known and easy to design. The examples given above as modifications to the block diagram of FIG. 2 are just that "examples". Numerous other uses will occur to those skilled in the art of designing signs for roads and pathways.

I claim:

1. A display device comprising a photovoltaic panel having a front surface to be exposed to ambient light, a back surface and at least one hole in said photovoltaic panel and at least one light emitting device passing through said hole such that said light emitting device is structurally integrated into said photovoltaic panel and said light emitting device emits light on said front surface of said photovoltaic panel whereby said photovoltaic panel forms a background for said light emitting device.

2. A display device of claim 1 wherein said at least one hole comprises a plurality of holes and said at least one light emitting device comprises a plurality of light emitting devices forming a coherent shape or character on the front surface of said photovoltaic panel.

3. A display device according to claim 1 wherein said display device comprises at least one light emitting diode.

4. A display device according to claim 1 wherein said light emitting device is a light selected from the group consisting: electroluminescent light, phosphorescent substance, chemiluminescent device, neon light, fluorescent light, infra-red light and incandescent light.

5. A display device according to claim 1 wherein said device further includes a storage battery adapted to store electricity produced by said photovoltaic panel and a circuit adapted to turn said display device on and off.

6. A device according to claim 5 wherein said circuit is activated by low levels of light approaching darkness.

7. A device according to claim 5 wherein said circuit is operated by one or more environmental factor such as temperature, motion detection, light level, or a timer.

8. A display device according to claim 1 wherein said photovoltaic panel has a coherent pattern of many holes and said light emitting device comprises multiple light emitting devices operated by a computer to produce a variable display.

9. A device according to claim 8 wherein the computer responds to a remote transmitting device such as a pager signal.

10. A display device according to claim 1 wherein said at least one light emitting device is placed into said hole and said photovoltaic panel and said at least one light emitting device is then sealed or re-encapsulated to form an integral sealed unit.

* * * * *